(12) United States Patent
Wang et al.

(10) Patent No.: US 9,595,478 B2
(45) Date of Patent: Mar. 14, 2017

(54) DUMMY GATE USED AS INTERCONNECTION AND METHOD OF MAKING THE SAME

(71) Applicant: GLOBALFOUNDRIES Inc., Grand Cayman (KY)

(72) Inventors: Wenhui Wang, Clifton Park, NY (US); Ryan Ryoung-han Kim, Albany, NY (US); Linus Jang, Clifton Park, NY (US); Jason Cantone, Mechanicville, NY (US); Lei Sun, Albany, NY (US); Seowoo Nam, Gyeonggi-do (KR)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/737,551

(22) Filed: Jun. 12, 2015

(65) Prior Publication Data

US 2016/0365288 A1    Dec. 15, 2016

(51) Int. Cl.
| | |
|---|---|
| *H01L 23/00* | (2006.01) |
| *H01L 21/8238* | (2006.01) |
| *H01L 29/66* | (2006.01) |
| *H01L 29/06* | (2006.01) |
| *H01L 21/02* | (2006.01) |
| *H01L 27/092* | (2006.01) |
| *H01L 23/528* | (2006.01) |

(52) U.S. Cl.
CPC .. *H01L 21/823828* (2013.01); *H01L 21/0217* (2013.01); *H01L 21/02126* (2013.01); *H01L 21/823864* (2013.01); *H01L 21/823871* (2013.01); *H01L 23/528* (2013.01); *H01L 27/092* (2013.01); *H01L 29/0649* (2013.01); *H01L 29/66545* (2013.01)

(58) Field of Classification Search
CPC .................. H01L 27/092; H01L 27/76897
USPC ..................................................... 257/369
See application file for complete search history.

(56) References Cited

U.S. PATENT DOCUMENTS

| | | | | |
|---|---|---|---|---|
| 2009/0286375 | A1* | 11/2009 | Nandakumar | .... H01L 21/28247 438/303 |
| 2012/0187504 | A1* | 7/2012 | Igarashi | ............ H01L 21/76895 257/390 |

\* cited by examiner

*Primary Examiner* — Tran Tran
(74) *Attorney, Agent, or Firm* — Ditthavong & Steiner, P.C.

(57) ABSTRACT

Process of using a dummy gate as an interconnection and a method of manufacturing the same are disclosed. Embodiments include forming on a semiconductor substrate dummy gate structures at cell boundaries, each dummy gate structure including a set of sidewall spacers and a cap disposed between the sidewall spacers; removing a first sidewall spacer or at least a portion of a first cap on a first side of a first dummy gate structure and forming a first gate contact trench over the first dummy gate structure; and filling the first gate contact trench with a metal to form a first gate contact.

12 Claims, 7 Drawing Sheets

DUMMY GATE USED AS INTERCONNECTION AND METHOD OF MAKING THE SAME

TECHNICAL FIELD

The present disclosure relates to the manufacture of semiconductor devices, and, more specifically, to a process to reduce the Metal 1 ("M1") congestion. The present disclosure is particularly applicable to semiconductor devices for the 10 and 7 nanometer (nm) technology nodes and beyond.

BACKGROUND

Semiconductor devices are used in a large number of electronic devices, such as computers, cell phones, and others. Semiconductor devices include integrated circuits that are formed on semiconductor wafers by depositing many types of thin films of material over the semiconductor wafers, and patterning the thin films of material to form the integrated circuits. One objective of the semiconductor industry is to continue shrinking the size of the circuits. However, as cell size of the circuits is scaled down with advances in the technology node, congestion in the M1 design becomes challenging. In particular, enabling a logic cell library without an improvement in resolution (e.g., use of extreme ultraviolet (EUV)) makes M1 design in a given cell track library (e.g., 9 track) difficult.

Figure 1:
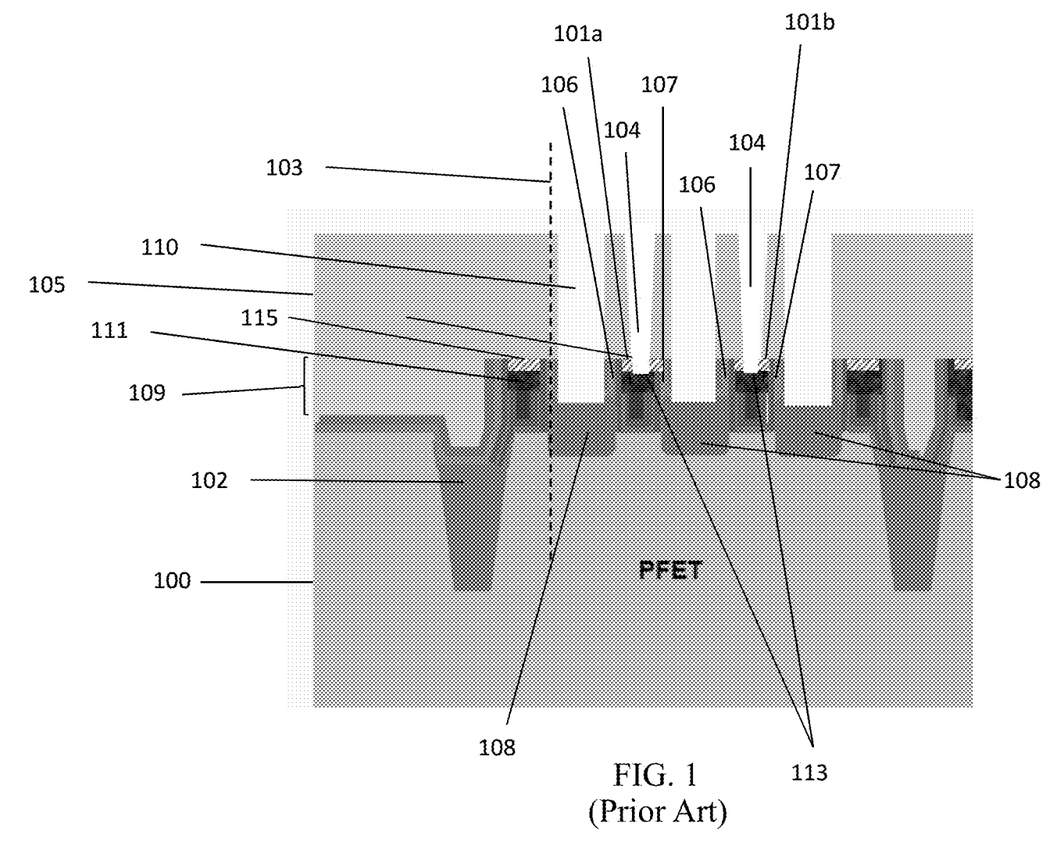
FIG. 1 schematically illustrates a cross sectional view of a conventional process of using a dummy gate structure to define a STI region.

As illustrated in FIG. 1, a dummy gate structure is regularly used to define a shallow trench isolation (STI) region. In particular, plural gate structures, for example 101a, 101b, are formed over a substrate 100. Gate structure 111 is a dummy gate structure, used to define a STI region 102 at an edge 103 of a cell region. A cavity 110 is formed adjacent the dummy gate structure 111. A cavity 104 is created in the real gate structures 101a, 101b by etching through a dielectric layer 105 and interlayer dielectrics 109 and cap formed between sidewall spacers 106, 107 of the real gate structures 101a, 101b. A cap is removed during this etching to produce recesses 113 in the real gate structures 101a, 101b between sidewall spaces 106, 107. A cavity 110 is formed adjacent the dummy gate structure 111. Gate structure 101a, 101b are formed between source/drain regions 108. The dummy gate structure 111 maintains the cap 115.

Figure 2:
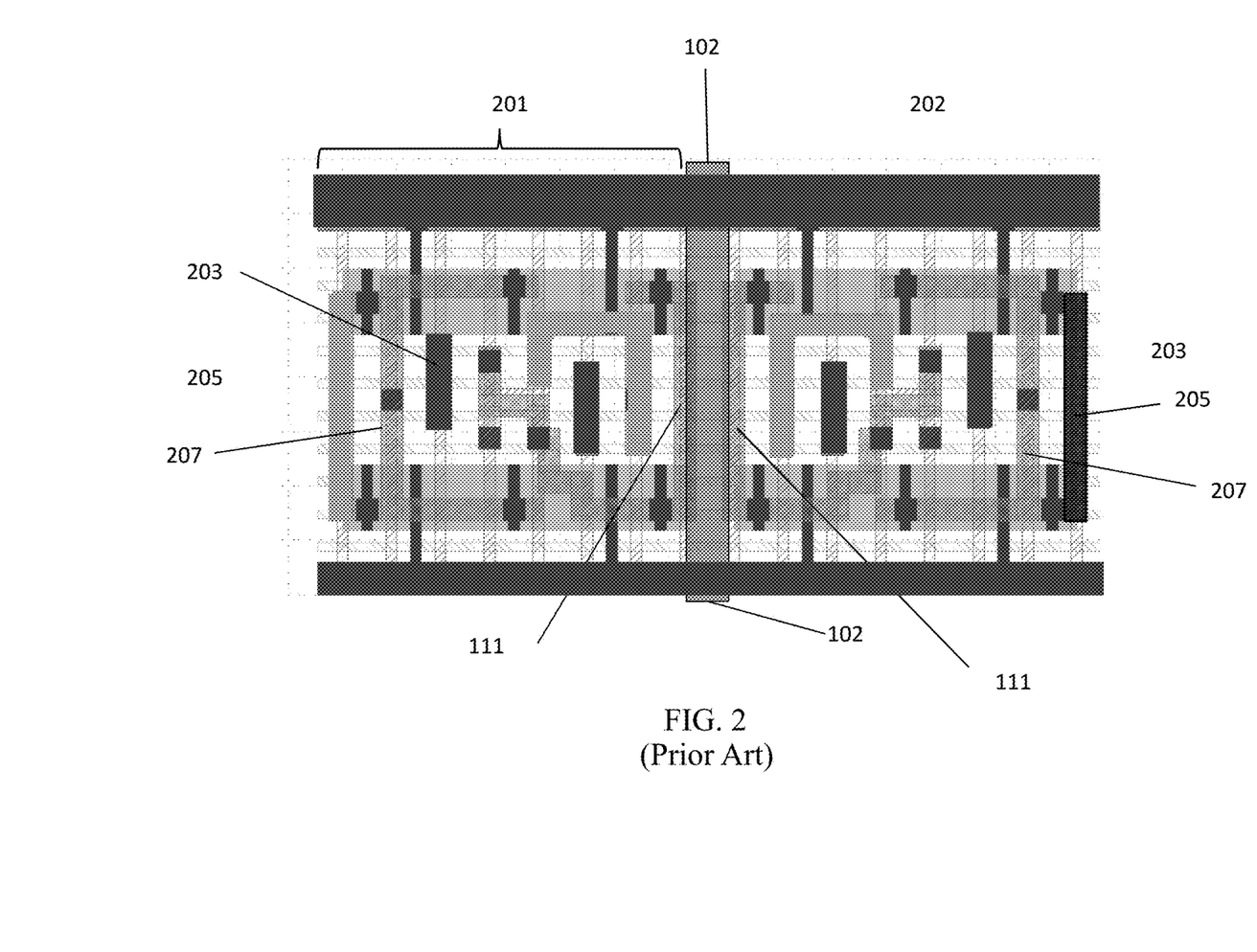
FIG. 2 schematically illustrates a conventional integrated circuit layout using dummy gate structures at edges of adjacent cells to define a STI region.

FIG. 2 illustrates a conventional integrated circuit layout with an STI region 102 disposed between two adjacent cells 201, 202. The STI region 102 is defined by dummy gate structure 111 located at an edge of cell 201, and dummy gate structure 111 located at an edge of cell 202. The M1 layer includes segments 203, 205, and 207. As illustrated, because of the congestion, the M1 layer requires three different colors for printability. Although the dummy gate structure is conventionally used to define STI regions, it does not sufficiently mitigate congestion in M1 design.

A need therefore exists for methodology to improve M1 design patterning by mitigating congestion (e.g., freeing up space) in M1 design without additional processing steps and the resulting device.

SUMMARY

An aspect of the present disclosure is to move a part of the M1 wire to a dummy gate electrode to free up space for M1 patterning. A gate contact can be used to short the dummy gate and contact to the active regions (i.e., source and drain regions) without changing of existing processing technology.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming on a semiconductor substrate dummy gate structures at cell boundaries, each dummy gate structure including a set of sidewall spacers and a cap disposed between the sidewall spacers; removing a first sidewall spacer or at least a portion of a first cap on a first side of a first dummy gate structure and forming a first gate contact trench over the first dummy gate structure; and filling the first gate contact trench with a metal to form a first gate contact.

Aspects of the present disclosure include removing a second sidewall spacer or a second cap on a second side of a second dummy gate structure and forming a second gate contact trench over the second dummy gate structure; and filling the first and second gate contact trenches with tungsten, tungsten alloy, copper, aluminum-copper alloy, or silicon-copper alloy. Other aspects include forming the first dummy gate structure on a PFET side of the semiconductor substrate; and forming the second dummy gate structure on a NFET side of the semiconductor substrate. Additional aspects include forming the first dummy gate structure over a first shallow trench isolation (STI) region; and forming the second dummy gate structure over a second STI region. Yet other aspects include forming the first and second gate contacts as fat or shifted gate contacts on the first and second dummy gate structures. Further aspects include forming the first and second sidewall spacers or first and second caps of a low-dielectric constant material or silicon nitride (SiN), wherein the removing of the first and second sidewall spacers or first and second caps comprises: etching the first sidewall spacer on the first side of the first dummy gate structure, and etching the second sidewall spacer on the second side of the second dummy gate structure. Another aspect includes the low-dielectric constant material being silicon oxycarbonitride (SiOCN). Further aspects include depositing a metallization layer over the first and second gate contacts. Yet other aspects include connecting a first source/drain structure of the first dummy gate structure with a second source/drain structure of the second dummy gate structure. Additional aspects include forming at least one real gate structure between the first and second dummy gate structures. Another aspect includes the at least one real gate structure being disposed between a source region and a drain region.

Another aspect of the present disclosure is a device including: a semiconductor substrate; a plurality of real gate structures disposed over the semiconductor substrate; a metallization layer disposed over the real gate structures; and a first dummy gate structure including a single sidewall spacer on a first side of the first dummy gate structure and a first gate contact over the first dummy gate structure, the first gate contact connected to a source/drain region on a second side.

Aspects include a second dummy gate structure including a single sidewall spacer on a second side of the second dummy gate structure and a second gate contact over the second dummy gate structure, the second gate contact connected to a source/drain region on a second side. Other aspects include the first and second gate contacts being filled with tungsten, tungsten alloy, copper, aluminum-copper alloy, or silicon-copper alloy. Yet other aspects include the first and second dummy gate structures formed over first and second shallow trench isolation regions. Further aspects include the first dummy gate structure is formed in a PFET region of the semiconductor substrate, the second dummy gate structure is formed in a NFET region of the semiconductor substrate; and the first or second dummy gate structure connects an NFET source/drain region and a PFET source/drain region. Other aspects include the first dummy gate structure is formed at a first edge of a cell, and the second dummy gate structure is formed at a second edge of the cell.)

Another aspect of the present disclosure is a method including: forming on a semiconductor substrate dummy gate structures at cell boundaries, each dummy gate structure including a set of sidewall spacers and a cap disposed between the sidewall spacers; forming first and second expanded gate contact trenches by simultaneously removing a first sidewall spacer on a first side of a first dummy gate structure and etching a first gate contact trench over the first dummy gate structure and removing second sidewall spacer on a second side of a second dummy gate structure and etching a second gate contact trench over the second dummy gate structure; forming real gate structures between the first and second dummy gate structures; and filling the first and second expanded gate contact trenches with tungsten, tungsten alloy, copper, aluminum-copper alloy, or silicon-copper alloy to respectively connect the first and second gate contacts with first and second source/drain regions.

Aspects of the present disclosure include forming the first dummy gate structure on a PFET side of the semiconductor substrate; and forming the second dummy gate structure on a NFET side of the semiconductor substrate. Other aspects include forming the first dummy gate structure over a first STI region; and forming the second dummy gate structure over a second STI region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of M1 design congestion attendant upon scaling down cell size in advanced technology nodes. By using a dummy gate structure as an interconnection without additional processing steps, space can be freed up in M1 design layout. The color of M1 can be reassigned after more space becomes available and printability is improved.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 3:
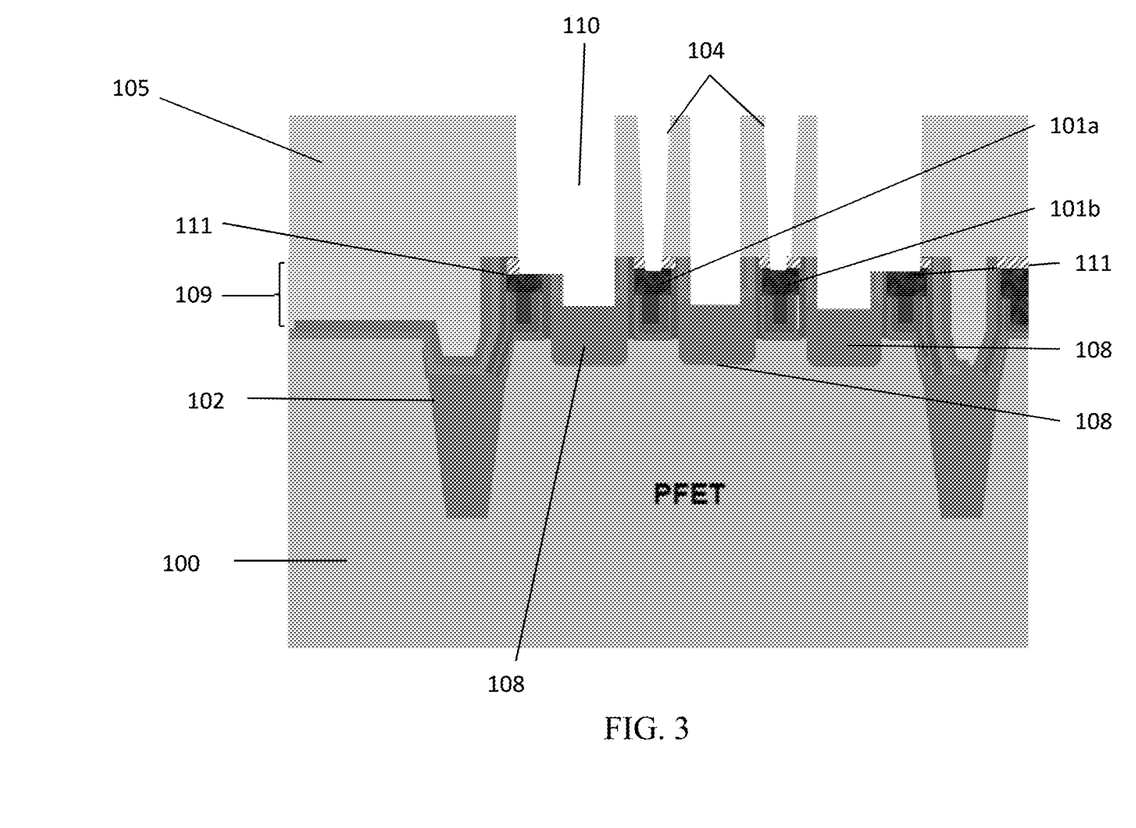
FIG. 3 schematically illustrates a cross sectional view of a gate contact etch of a dummy gate structure, in accordance with an exemplary embodiment.

Adverting to FIG. 3, plural gate structures, for example 101a, 101b are formed over a substrate 100. Gate structure 111 is a dummy gate structure formed at an edge of a cell region. A cavity 110 is created over the dummy gate structure 111, for forming a gate contact, by etching through a oxide layer/dielectric layer 105 and interlayer dielectrics (ILDs) 109 and the cap layer 115 (FIG. 1). The formation of the cavity 110 also removes the cap 115 and sidewall spacer closest to the cell edge and leaves behind only one of the sidewall spacers of the dummy gate structure 111. Each of the real gate structures 101a, 101b is formed between source/drain regions 108. Each dummy gate will only have one source/drain region on one side and the other side is empty.

Figure 4:
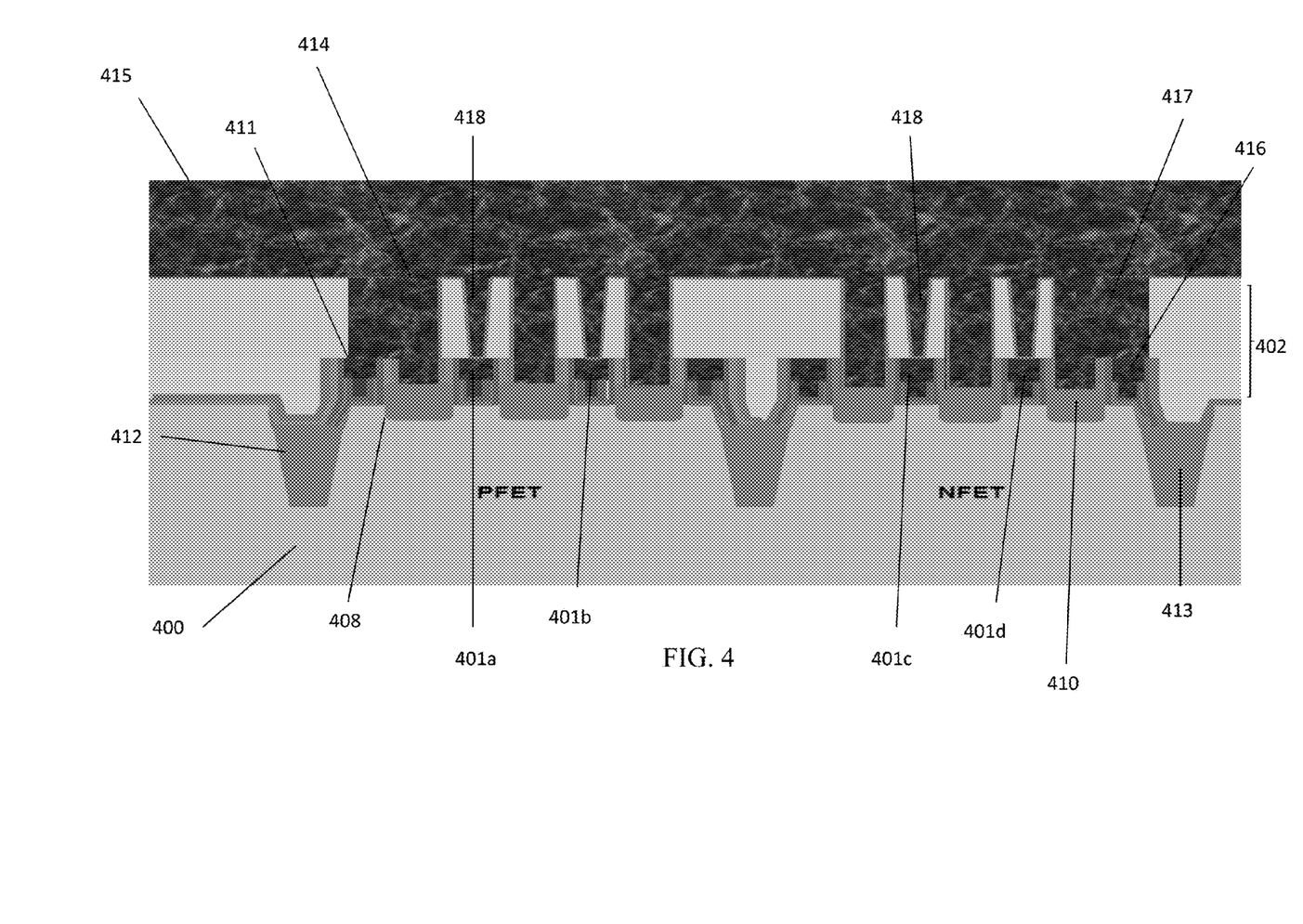
FIG. 4 schematically illustrates a cross sectional view of a gate contact etch of dummy gate patterns in PFET and NFET regions, in accordance with an exemplary embodiment.

FIG. 4 schematically illustrates a cross sectional view of a plurality of gate structures in PFET and NFET regions of a cell after a metal filling step is formed to produce metal gate structures. During the etching of the dielectric, ILDs 402 and a part or all of the cap layer 115 (FIG. 1) to form gate contact trenches, a sidewall spacer and cap on a cell edge side of a dummy gate structure 411 in the PFET region is removed leaving only one sidewall spacer. During the same etching step, the sidewall spacer and cap on the opposite cell side of a dummy gate structure 416 in the NFET region is removed leaving only one sidewall spacer. The etching step for forming the gate contact trenches and for removing one of the sidewall spacers of each dummy gate is a nitride type etch. Also during the same etch, gate contact trenches for real gate structures 401*a* and 401*b* (PFET side) are also formed, but with both sets of sidewall spacers remaining for the real gate structures 401*a* and 401*b*. Also during the same etch, gate contact trenches for real gate structures 401*c* and 401*d* (NFET side) are also formed, but with both sets of sidewall spacers remaining for the real gate structures 401*c* and 401*d*.

The gate contact trenches for dummy gate structures 411, 416 are filled with a metal 414, 417 to respectively form gate contacts for the gate structures at the edges of the PFET and NFET regions. Further, contact trenches for real gate structures 401*a*, 401*b*, 401*c*, and 401*d* are also filled with metal 418. The contact to the active region (i.e., source/drain region) 408 is connected with the gate contact 414 formed over adjacent STI region 412 in PFET region. Similarly, the contact to the active region (i.e., source/drain region) 410 is connected with the gate contact 417 formed adjacent STI region 413 in the NFET region. The metal in each 414, 415, 418 and 417 is the same. Metal layer 415 is subsequently removed after the trench fill by a planarizing technique such as chemical mechanical planarization (CMP). Metallization layers can be formed after the CMP.

Figure 5A:
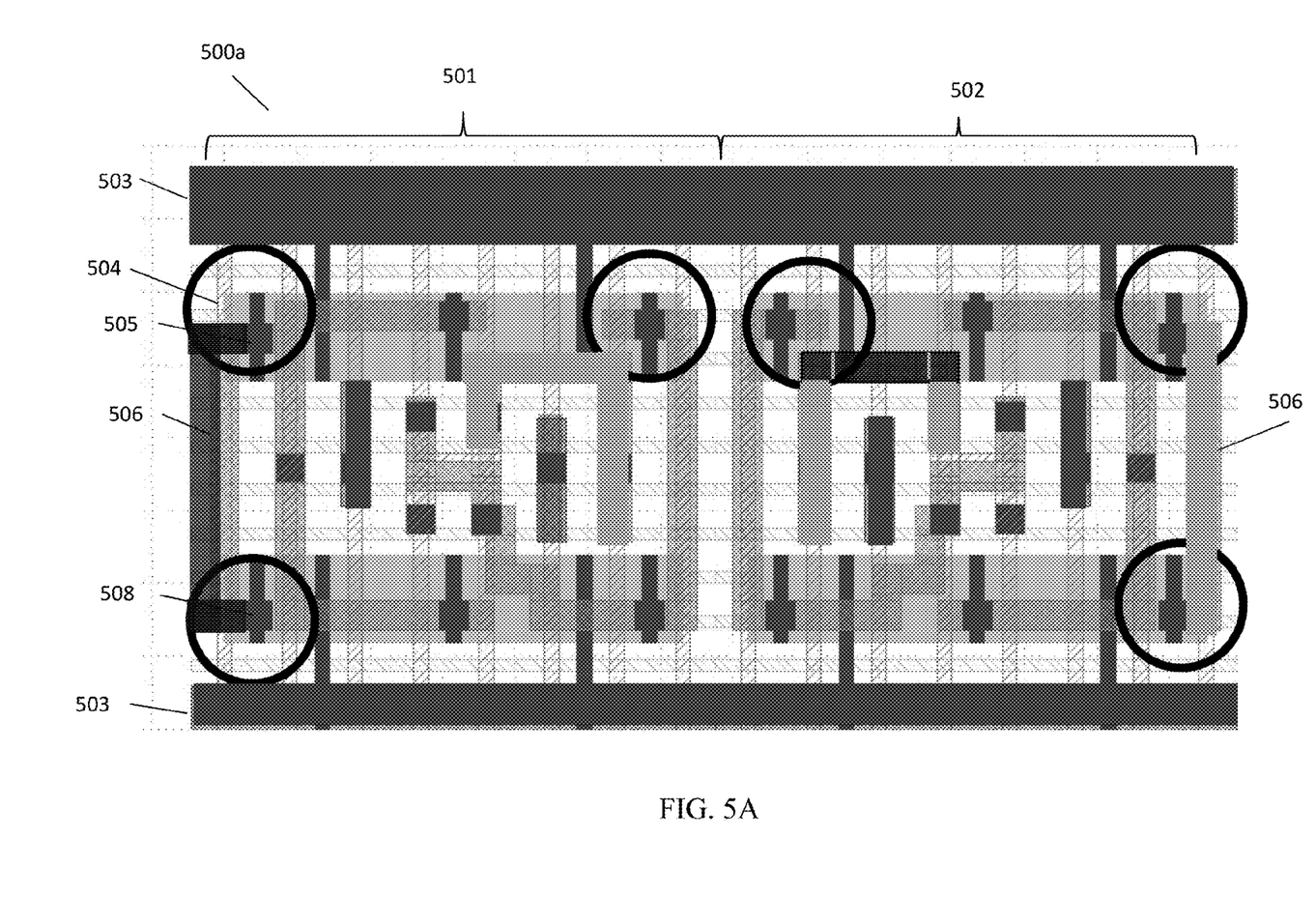
FIGS. 5A and 5B schematically illustrate integrated circuit layouts, in accordance with an exemplary embodiment.

Adverting to FIG. 5A, an integrated circuit layout 500*a* is illustrated. Cells 501 and 502 are disposed between power rails 503. When a dummy gate electrode 504 and a via 505 to the source/drain regions are connected in the circled regions of FIG. 5A, M1 is needed at, for example, 506. Metal 506 is used to connect source drain 505 to 508 using via 505.

Figure 5B:
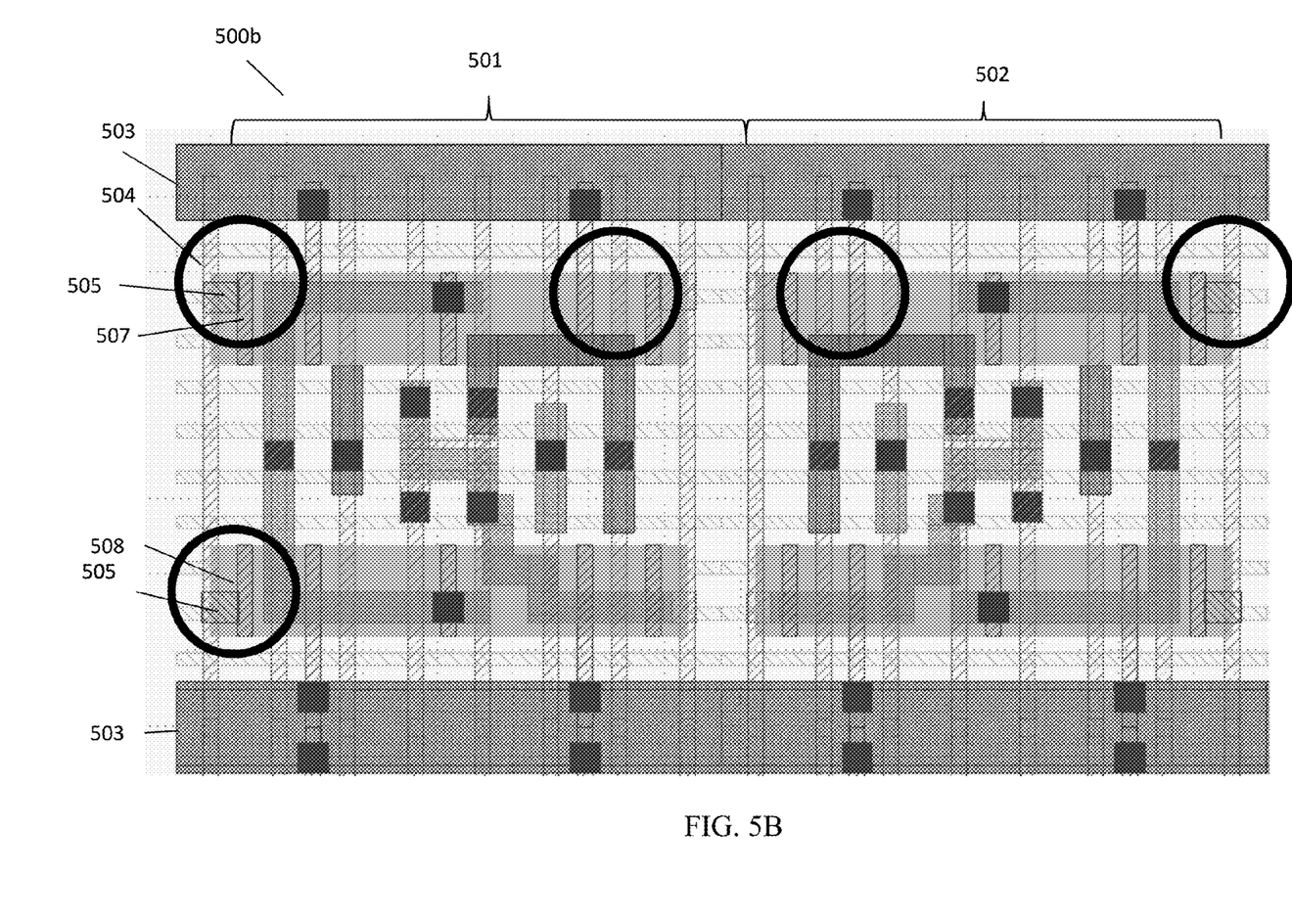

FIG. 5B illustrates integrated circuit layout 500*b* with the dummy gate used as an interconnection by forming a fat or shifted gate contact 505 connected to source/drain 507 in the circled regions of cells 501 and 502. Connection between 507 and 508 is established by dummy gate and shifted gate contact 505. Metal line is no longer needed. The color of M1 can be reassigned after more space becomes available as a result of the dummy gate being used as an interconnection. Printability is improved as compared with the layout in FIG. 5A.

Figure 6:
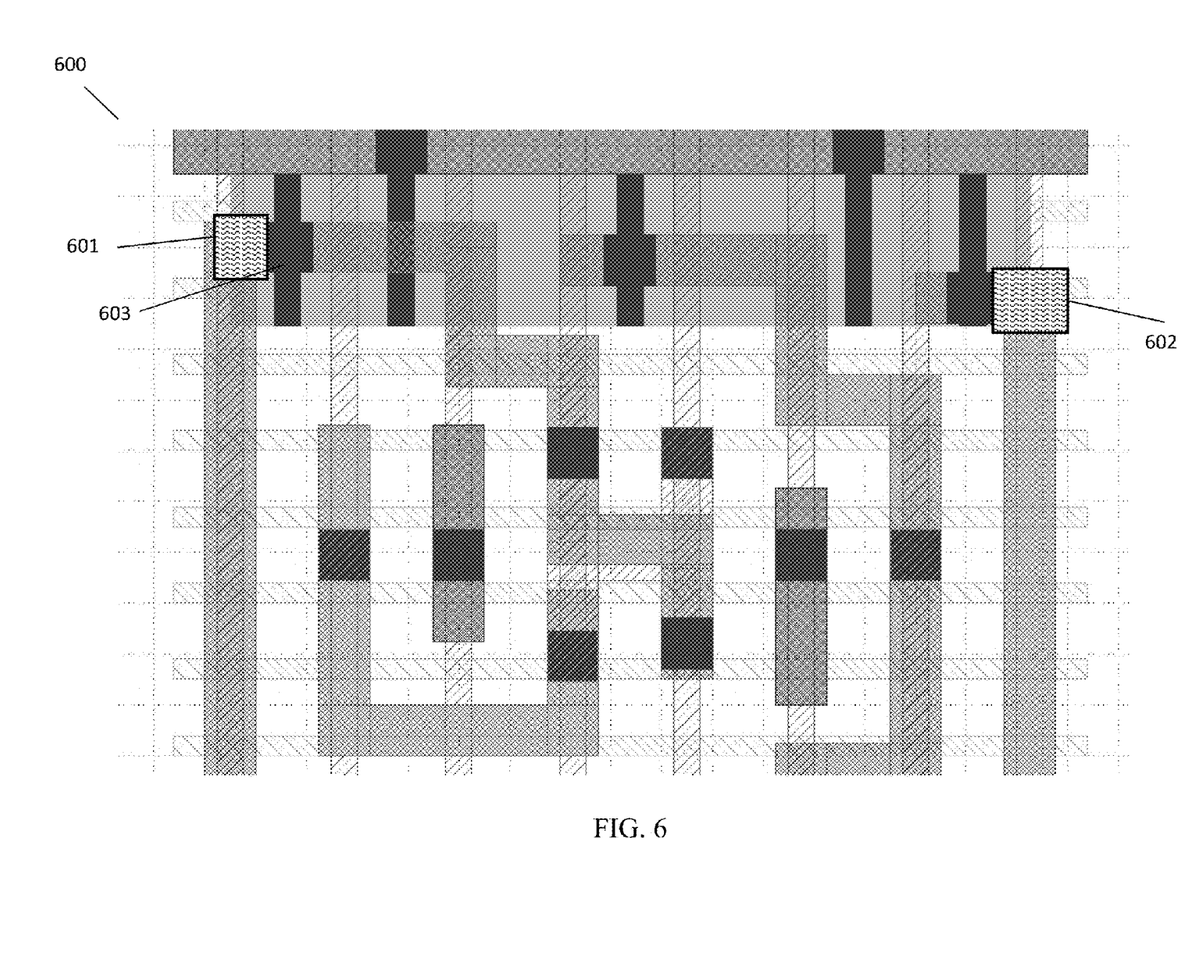
FIG. 6 schematically illustrates an integrated circuit layout, in accordance with an exemplary embodiment.

Adverting to FIG. 6 integrated circuit layout 600 is illustrated in which fat or shifted gate contacts 601, 602 are formed on dummy gate structures, connected to source/drain contacts 603. Accordingly, the M1 colors have been reassigned.

The embodiments of the present disclosure can achieve several technical effects, such as mitigating congestion in M1 design layout by using a dummy gate as an interconnection. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices using a dummy gate as an interconnection particularly for the 10 nm, 7 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
  forming on a semiconductor substrate dummy gate structures at cell boundaries, each dummy gate structure including a set of sidewall spacers and a cap disposed between the sidewall spacers;
  removing a first sidewall spacer or at least a portion of a first cap on a first side of a first dummy gate structure and forming a first gate contact trench over the first dummy gate structure;
  filling the first gate contact trench with a metal to form a first gate contact;
  removing a second sidewall spacer or a second cap on a second side of a second dummy gate structure and forming a second gate contact trench over the second dummy gate structure;
  filling the first and second gate contact trenches with tungsten, tungsten alloy, copper, aluminum-copper alloy, or silicon-copper alloy; and
  forming at least one real gate structure between the first and second dummy gate structures.

2. The method according to claim 1, comprising:
  forming the first dummy gate structure on a PFET side of the semiconductor substrate; and
  forming the second dummy gate structure on a NFET side of the semiconductor substrate.

3. The method according to claim 2, further comprising:
  forming the first dummy gate structure over a first shallow trench isolation (STI) region; and
  forming the second dummy gate structure over a second STI region.

4. The method according to claim 1, comprising forming the first and second gate contacts as shifted gate contacts on the first and second dummy gate structures.

5. The method according to claim 4, further comprising forming the first and second sidewall spacers or first and second caps of a low-dielectric constant material or silicon nitride (SiN), wherein the removing of the first and second sidewall spacers or first and second caps comprises:
  etching the first sidewall spacer on the first side of the first dummy gate structure, and
  etching the second sidewall spacer on the second side of the second dummy gate structure.

6. The method according to claim 5, wherein the low-dielectric constant material is silicon oxycarbonitride (SiOCN).

7. The method according to claim 1, further comprising:
  depositing a metallization layer over the first and second gate contacts.

8. The method according to claim 1, further comprising:
  connecting a first source/drain structure of the first dummy gate structure with a second source/drain structure of the second dummy gate structure.

9. The method according to claim 1, wherein the at least one real gate structure is disposed between a source region and a drain region.

10. A method comprising:
  forming on a semiconductor substrate dummy gate structures at cell boundaries, each dummy gate structure including a set of sidewall spacers and a cap disposed between the sidewall spacers;
  forming first and second expanded gate contact trenches by simultaneously removing a first sidewall spacer on a first side of a first dummy gate structure and etching a first gate contact trench over the first dummy gate structure and removing second sidewall spacer on a second side of a second dummy gate structure and etching a second gate contact trench over the second dummy gate structure;

forming real gate structures between the first and second dummy gate structures; and filling the first and second expanded gate contact trenches with tungsten, tungsten alloy, copper, aluminum-copper alloy, or silicon-copper alloy to respectively connect the first and second gate contacts with first and second source/drain regions.

11. The method according to claim 10, comprising:

forming the first dummy gate structure on a PFET side of the semiconductor substrate; and forming the second dummy gate structure on a NFET side of the semiconductor substrate.

12. The method according to claim 10, comprising:

forming the first dummy gate structure over a first shallow trench isolation (STI) region; and forming the second dummy gate structure over a second STI region.

* * * * *